(12) United States Patent
Yang

(10) Patent No.: US 6,700,168 B2
(45) Date of Patent: Mar. 2, 2004

(54) LAYOUT STRUCTURE AND METHOD OF A COLUMN PATH OF A SEMICONDUCTOR MEMORY DEVICE

(75) Inventor: Hyang-Ja Yang, Kyonggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/801,569

(22) Filed: Mar. 7, 2001

(65) Prior Publication Data

US 2001/0043483 A1 Nov. 22, 2001

(30) Foreign Application Priority Data

Mar. 7, 2000 (KR) .......................................... 2000-11242

(51) Int. Cl.⁷ .............................................. H01L 29/76
(52) U.S. Cl. ..................... 257/401; 257/213; 257/296; 257/309; 257/390
(58) Field of Search ................................. 257/296, 213, 257/309, 390, 401; 365/51, 190, 207, 208, 230.03, 230.06

(56) References Cited

U.S. PATENT DOCUMENTS

| | | | | |
|---|---|---|---|---|
| 5,313,426 A | * | 5/1994 | Sakuma et al. | 365/205 |
| 5,831,912 A | * | 11/1998 | Mueller et al. | 365/190 |
| 5,917,247 A | * | 6/1999 | Narita | 257/532 |
| 5,923,605 A | * | 7/1999 | Mueller et al. | 365/230.03 |

* cited by examiner

Primary Examiner—Richard Elms
Assistant Examiner—Doug Menz
(74) Attorney, Agent, or Firm—Marger Johnson & McCollom P.C.

(57) ABSTRACT

A layout structure of column pass transistors of a semiconductor memory device, in which the area occupied with the transistors is reduced. Thus, in spite of high integration of the semiconductor memory device and miniaturization of memory cells, column path transistors can be arranged efficiently. In the aforementioned layout structure, the active regions of the column path transistors are longitudinally in perpendicular to the bit line pairs to reduce the area occupied with the total number of memory cells.

18 Claims, 12 Drawing Sheets

FIG. 3
61·71
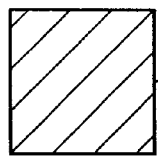
— FIRST METAL LINE
(METAL I LINE)
BITLINE OR
SECTIONDATALINE
80
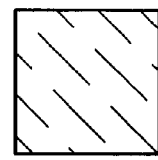
— TUNGSTEN LINE
(METAL Φ LINE)
FIRST OR SECOND
CONTACT LINE
30
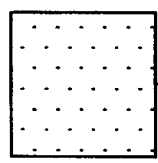
— n
NON-SHARED ACTIVE REGION(S/D)
10
— G-poly
GATE
40
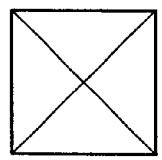
FIRST OR SECOND CONTACT
8
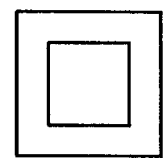
THIRD CONTACT
(CONTACT Φ )
20
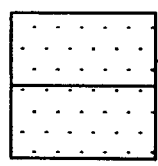
— n
SHARED ACTIVE REGION(D/S)

LAYOUT STRUCTURE AND METHOD OF A COLUMN PATH OF A SEMICONDUCTOR MEMORY DEVICE

BACKGROUND OF THE INVENTION

1. Field of the Invention

The present invention relates to a layout structure of a semiconductor memory device and more particularly to a layout structure and method of a column path of a semiconductor memory device for accomplishing high integration on a minimized layout area of column pass transistors connected to memory cells, thereby effectively constructing a layout structure of the column pass transistors.

2. Description of the Prior Art

Since the metal oxide semiconductor (MOS) transistor was invented to replace a bipolar transistor, semiconductor memory device technology has made amazing progress all over the world very recently.

Such noteworthy progress in the semiconductor memory device has also triggered another advance in the high integration technology by which a great number of elements are integrated on a single wafer. Such a technological improvement in a highly integrated device has been attributed to a revolutionary technology called "very large scale integration (VLSI)." The VLSI revolutionary technology takes a lead in the field of micro-electronics represented by ultra-fine process techniques, sub-micron element techniques, circuit designing techniques in dynamic random access memory (hereinafter referred to as DRAM) and static random access memory (hereinafter referred to as SRAM).

Among these advances, the technical progress in the ultra-fine process techniques and the sub-micron element techniques leads to high integration and large capacity of a semiconductor memory device characterized by memory cells of a smaller size.

However, the area occupied with the interface or peripheral circuits of the memory cells becomes relatively large in contrast to miniaturization of the memory cells, so that this interface or peripheral circuit area becomes one of the important factors in determining the size of a chip. This remains as a problem to all semiconductor manufacturers that develop a miniature chip under high density. In other words, development of a miniaturized chip layout structure becomes an important factor in miniaturizing various electronic products including the semiconductor memory device, thereby to improve the competitiveness of those products.

Among them, the area of the column path to provide a read/write data path of a memory cell is an important factor in determining the size of a chip, so that it is necessary to make a layout structure wherein the area of the column path is a minimum allowable in accordance with the design rule of the chip.

In general, the layout structure of the cell interface has been determined according to the shape of the memory cell, which heretofore as been made with a long Y-axis. Due to limitations of the design rule, linear column pass transistors, e.g. NMOS or PMOS transistors, have been arranged in parallel to the bit line pairs BL/BLB. However, if the X-axis of a memory cell gets too short, there may be a reduction in the area of the column pass transistors to be arranged in the bit line pairs.

Moreover, there may be a limitation in the conventional layout structure due to the reduction to be made in the tiny area for column pass transistors. In other words, scaling down of each memory cell can lead to a reduction in the area to be occupied by all memory cells, so that it becomes impractical to use the conventional layout structure of the column pass transistors. Thus, in order to accommodate smaller memory cells, the layout structure of a cell interface, for instance, the column pass transistors, should be improved as the scaling down of the chip continues.

Therefore, the conventional layout structure of the column pass transistors may no longer be properly applied to the miniature memory cells in the near future. Thus, it is required to develop a layout structure of the column pass transistors that is different from the conventional one since it is easily predicted that memory cells will be smaller and smaller.

However, if a proper layout structure cannot be made for the column pass transistors, all the efforts focused on miniaturization of a memory cell will be in vain in spite of a success in making a smaller memory cell. In other words, if a more efficient layout structure of column pass transistors is developed along with a progress in miniaturization of a memory cell, it will make a contribution to miniaturization of a chip. If a newly developed layout structure of the column pass transistors can further reduce the area for the column pass transistors, it will be advantageous in miniaturization of a semiconductor chip and enhancement of all manufacturers' efforts to reduce the size of a chip.

Besides, there has been another problem in the conventional column path layout structure in that the bit lines and the section data lines commonly combining inputs and outputs are made of different materials. For example, the bit lines typically have been made of a first metal layer and the section data lines have been made of a different metal, e.g., tungsten. Thus, undesirable loading of the inputs and outputs increases.

SUMMARY OF THE INVENTION

The present invention to solves the aforementioned problems and it is an object of the present invention to provide a layout structure of column pass transistors which can be efficiently arranged in the area of memory cells which may be manufactured much smaller than the conventional layout structure.

It is another object of the present invention to provide a column path layout structure of a semiconductor memory device not only to reduce the size of memory cells, but also effectively and efficiently to make a contribution to miniaturization of chips for a semiconductor memory device.

It is still another object of the present invention to provide a column path layout structure of a semiconductor memory device and a method related thereto that can solve the aforementioned problem of increased loads on bit lines and section data lines made of different materials.

In order to accomplish the aforementioned objects of the present invention, there is provided a column path layout structure of a semiconductor memory device wherein the longitudinal direction of active regions of the same conductivity type of first and second transistors respectively connected to bit lines further connected with a plurality of memory cells is approximately perpendicular to that of the bit line pairs.

BRIEF DESCRIPTION OF THE DRAWINGS

For a more complete understanding of the nature and objects of the invention, reference should be made to the following detailed description taken in conjunction with the accompanying drawings in which:

FIG. 3 includes diagrams explaining certain layout structures of column pass transistors shown in FIGS. 4 through 7;

DETAILED DESCRIPTION OF THE INVENTION

Figure 1:
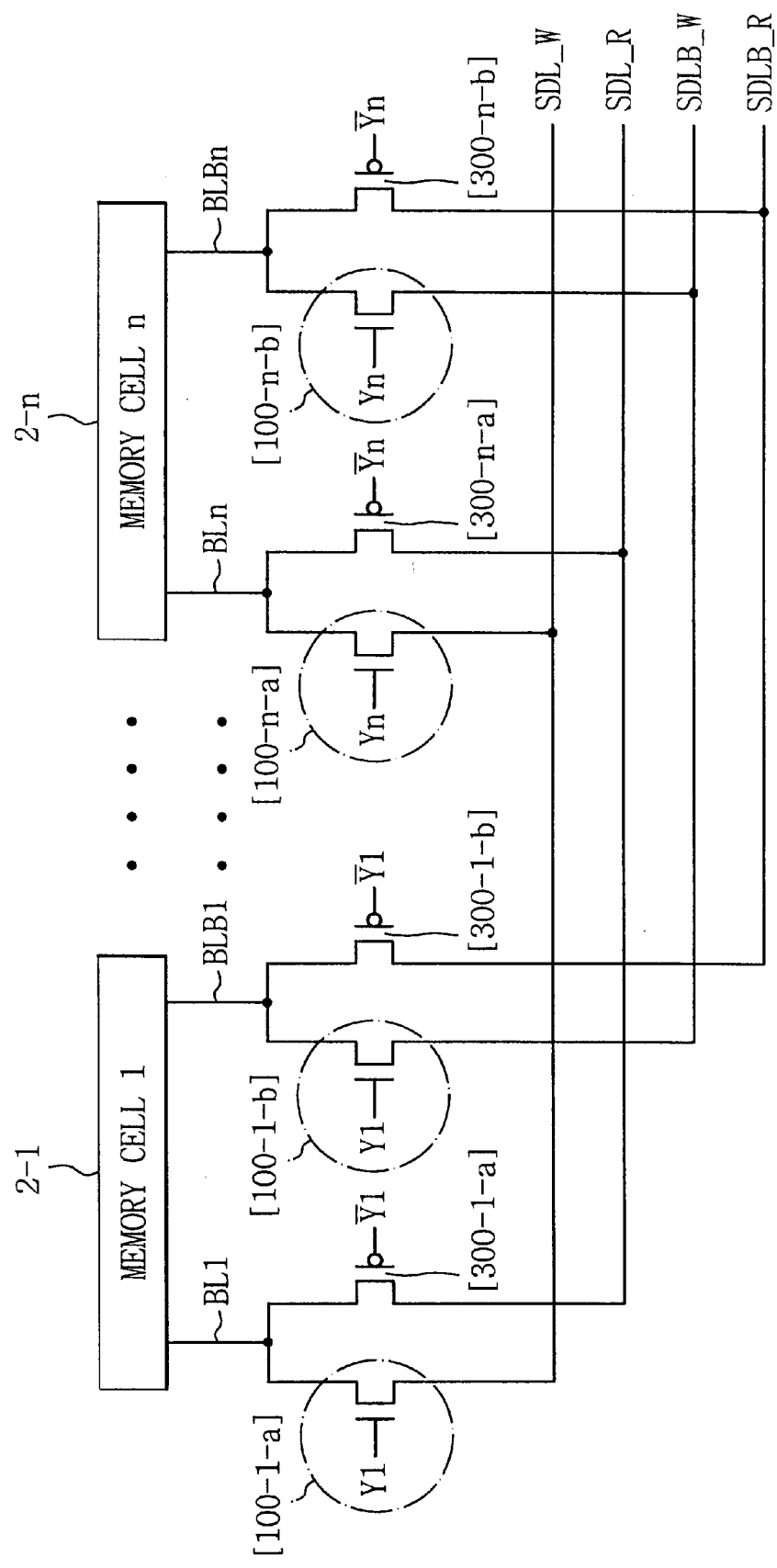
FIG. 1 is an equivalent circuit diagram for illustrating conventional column pass transistors of a semiconductor memory device.

Objects and aspects of the invention will become apparent from the following detailed description of preferred embodiments with reference to the accompanying drawings. Like reference numerals and symbols are used for designation of like or equivalent parts or portions for simplicity of illustration and explanation, repetitive detailed descriptions of which will be omitted. In addition, a number of particularly detailed descriptions of specific layout processes are provided for a further understanding of the present invention. It should also be noted that detailed descriptions about widely recognized techniques or structures unnecessary to clarify the key points of the present invention will be omitted.

Figure 2:
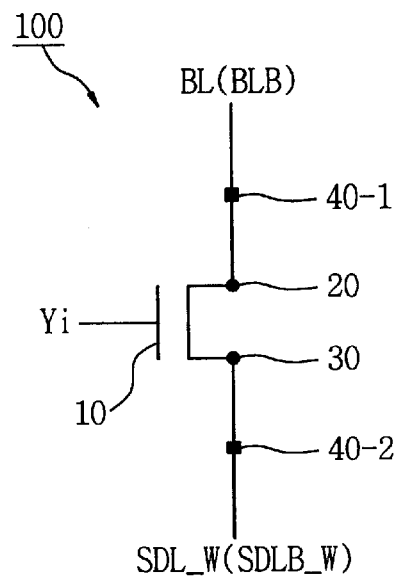
FIG. 2 is an equivalent circuit diagram for illustrating a write path of a conventional semiconductor memory device for a single bit line.

A conventional circuit arrangement of column pass transistors on a given column path of a semiconductor memory device shown in FIGS. 1 and 2.

FIG. 1 is an equivalent circuit for illustrating a given column path of a semiconductor memory device, specifically an SRAM. FIG. 2 is an equivalent circuit for illustrating a write path of a semiconductor memory device relating to a single bit line. Bit line pairs BL, BLB are connected to provide write and read data paths onto a column path in a memory cell. Each of the bit lines includes NMOS transistors used as column pass transistors on the write column path of a section data line and PMOS transistors used as column pass transistors on the read column path of a section data line.

As shown in FIG. 1, the equivalent circuit of the given column pass transistors comprises: bit line pairs BL1/BLB1, BLn/BLBn respectively connected to a plurality of memory cells; identical conductivity type column pass transistors (NMOS transistors) [100-n-a/b] connected between bit line pairs and write section data lines SDL_W/SDLB_W; and an identical conductivity type of column pass transistors (PMOS transistors) [300-n-a/b] connected between bit line pairs and read section data lines SDL_R/SDLB_R. The section data line SDL_R of the read path commonly belong to the column pass transistors (PMOS transistors) [300-i-a] connected to the bit lines BL of all memory cells, and the section data line bars SDLB_R commonly belong to the column pass transistors (PMOS transistors) [300-i-b] connected to the bit line bars BLB of all memory cells. For a predetermined memory cell number, a first transistor for bit lines BL and a second transistor for bit line bars BLB are respectively designated by 'a' and 'b' in the drawings, 'i' being the generic designator (index). In addition, the column pass transistors of the write path and those of the read path are respectively designated by reference numerals 100, 300. Furthermore, the column path of the bit lines will be understood generally to be referred to as the "Y-Path."

On the other hand, the column pass transistors applied to a column path layout structure of the present invention can be applied to all the column pass transistors constructed on the read and write paths. It should be noted that detailed description of the present invention will be limited to the column pass transistors (NMOS transistors) constructed on the write path. For other cases, Table 1 will be referenced for further descriptions.

FIG. 2 illustrates the layout structure of a memory cell interface, as including column pass transistors on the write path. In other words, FIG. 2 is a circuit diagram for illustrating the layout structure of a NMOS transistor (designated by [100-i-a/b] in FIG. 1) constructed on the write path of each bit line BL or BLB. The bit line BL/BLB is connected to an active region of NMOS transistor (drain) 20 through a first contact 40-1, and the other active region of the NMOS transistor (source) 30 is connected with a section data line SDL_W/SDLB_W through second contact 40-2. Furthermore, a gate 10 of the NMOS transistor is connected to a gate signal Yi, where 'i' will be understood to refer to any given instant of such a gate signal.

In practice, there are specific layers and operational sequences for arranging a bit line, an active region, a gate and a section data line described above. Since the specific layers and operational sequences are identical to those in the prior art, there is no need to describe them in detail. Only a brief description will be made about the layout structure of those layers applied to the present invention with reference to FIG. 7.

Figure 7:
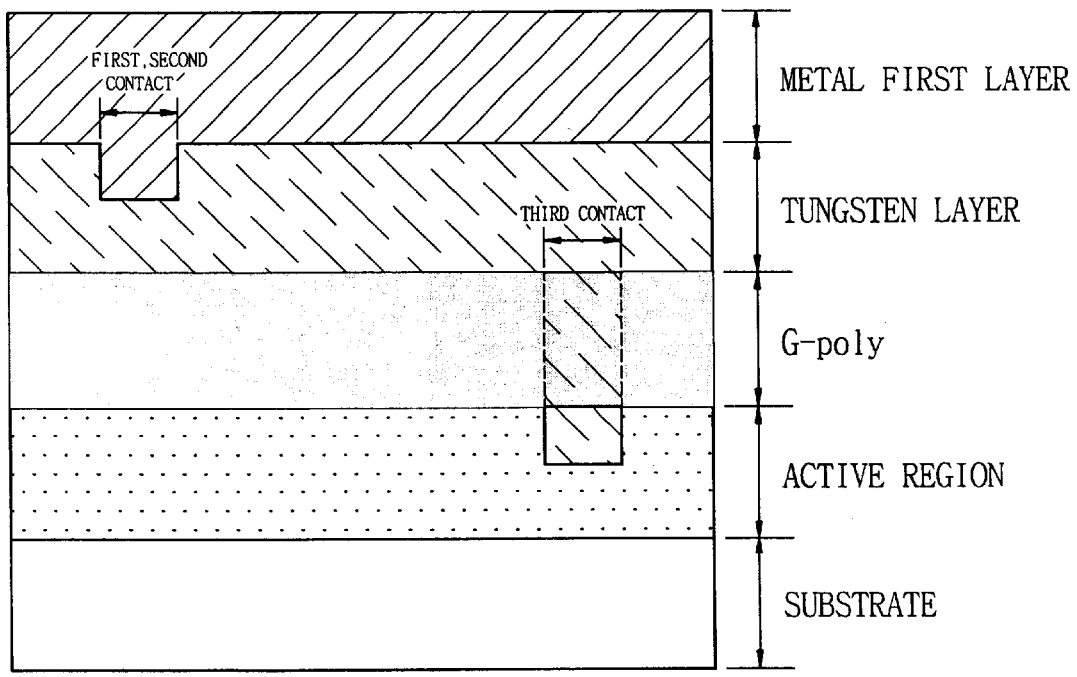
FIG. 7 is a top plan view for illustrating a layout structure in accordance with an embodiment of the present invention.

As shown in FIG. 7, the layout structure includes a substrate-active region-gate polysilicon-tungsten layer-a first metal layer vertically stacked from the bottom to the top. An oxide layer and an insulating layer required in the process of manufacturing layers of a semiconductor memory device are omitted in FIG. 7. In addition, the first and second contacts show the contacts between the first metal layer and a metal conductivity type layer, e.g. a tungsten layer. The third contact shows the contact between a metal conductivity type layer, e.g. a tungsten layer and an active region. On the other hand, it should be noted that FIG. 7 is mainly presented to show vertical positions of layers to help understand the layout structure of layers, not necessarily to indicate horizontal positions of a column pass transistor in a semiconductor memory device of the present invention. Even if a third contact appears to be in contact with the active region through the gate polysilicon layer in FIG. 7, it should be understood by one skilled in the art that the third contact is actually kept in contact through a central insulating layer (not shown), for example, an oxide layer positioned at the upper portion of the active region far from the gate polysilicon layer.

FIG. 3 includes explanatory diagrams for illustrating the layout structures applied to embodiments of the present invention that will be described below, that is, layout structures shown in FIGS. 4 through 7.

In the first embodiment of the present invention, both bit lines 61 and section data lines 71 are named, first layers of metal lines ('the first metal line' or 'metal line 1'). The first metal line is made, e.g., of aluminum Al. Also, the first and second contact lines relate to identical tungsten lines 80 (also referred to as 'metal 100 line') or they are differently named simply to distinguish contact lines having the bit lines 61 from those having the section data lines 71 for convenience. Accordingly, it should be noted that the first and second contacts are constructed as identical layers that are distinguished, for simplicity of description, in the embodiments of the present invention.

On the other hand, even if both reference numerals 20, 30 indicate N type active regions in FIG. 3, they are distinguished for non-shared and shared active regions, respectively, in the embodiments of the present invention. In other words, reference numeral 30 indicates a drain.

Hereinafter, a column path layout structure will be described in detail in accordance with the first embodiment of the present invention.

Figure 4:
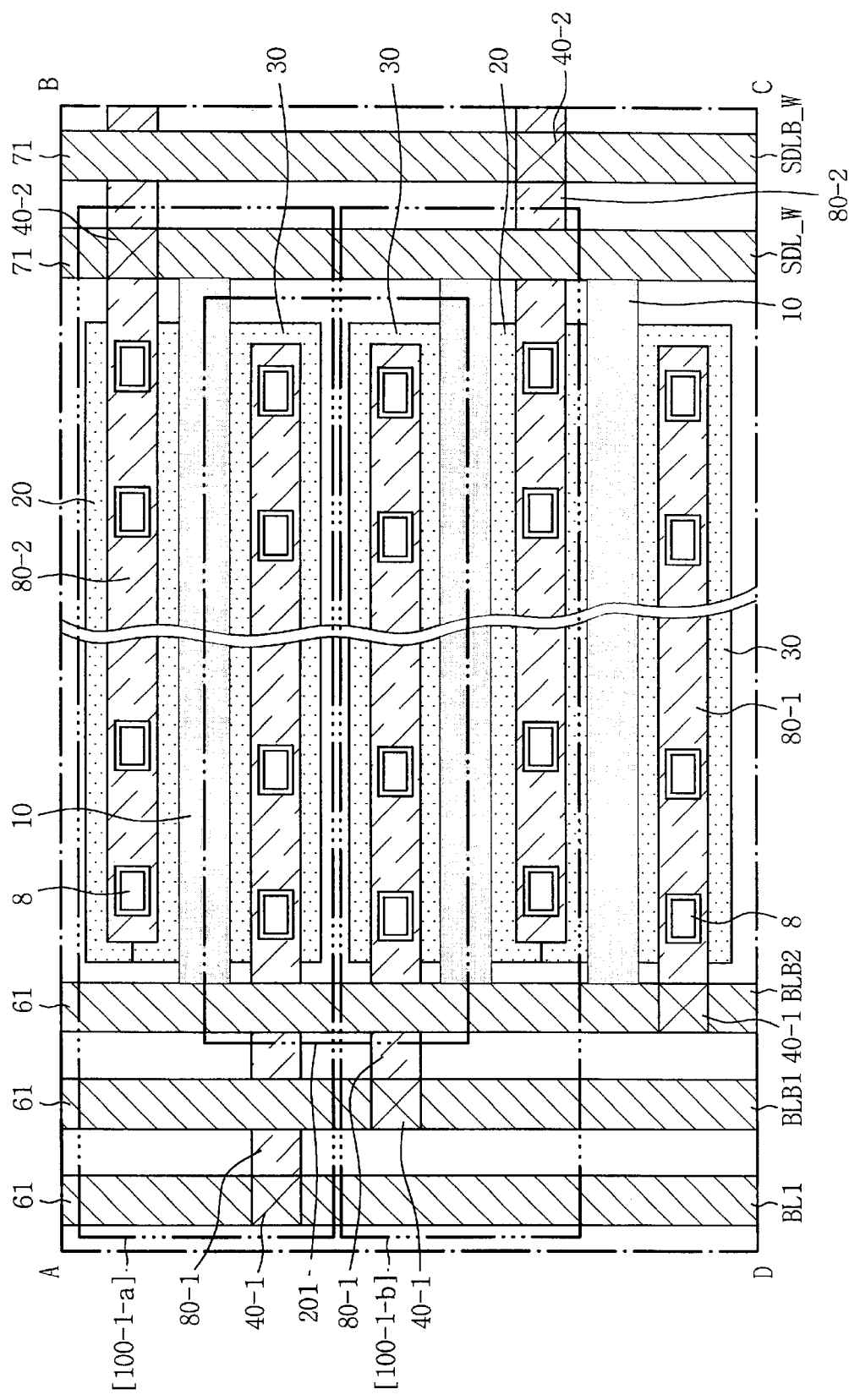
FIG. 4 is a top plan view for illustrating a partial layout structure of column pass transistors of a semiconductor memory device in accordance with a first embodiment of the present invention.
Figure 5:
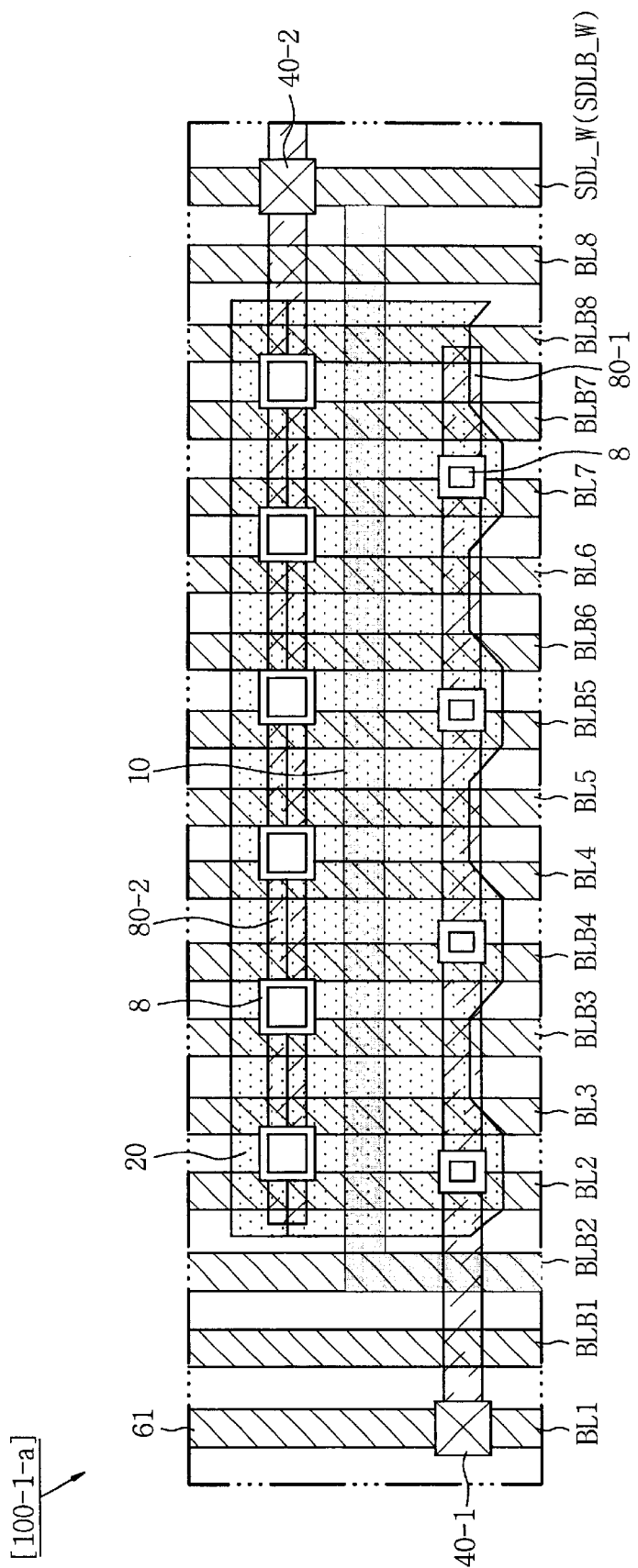
FIG. 5 is a top plan view for illustrating an arrangement of a single transistor in the layout structure of column pass transistors in accordance with the first embodiment of the present invention.
Figure 6:
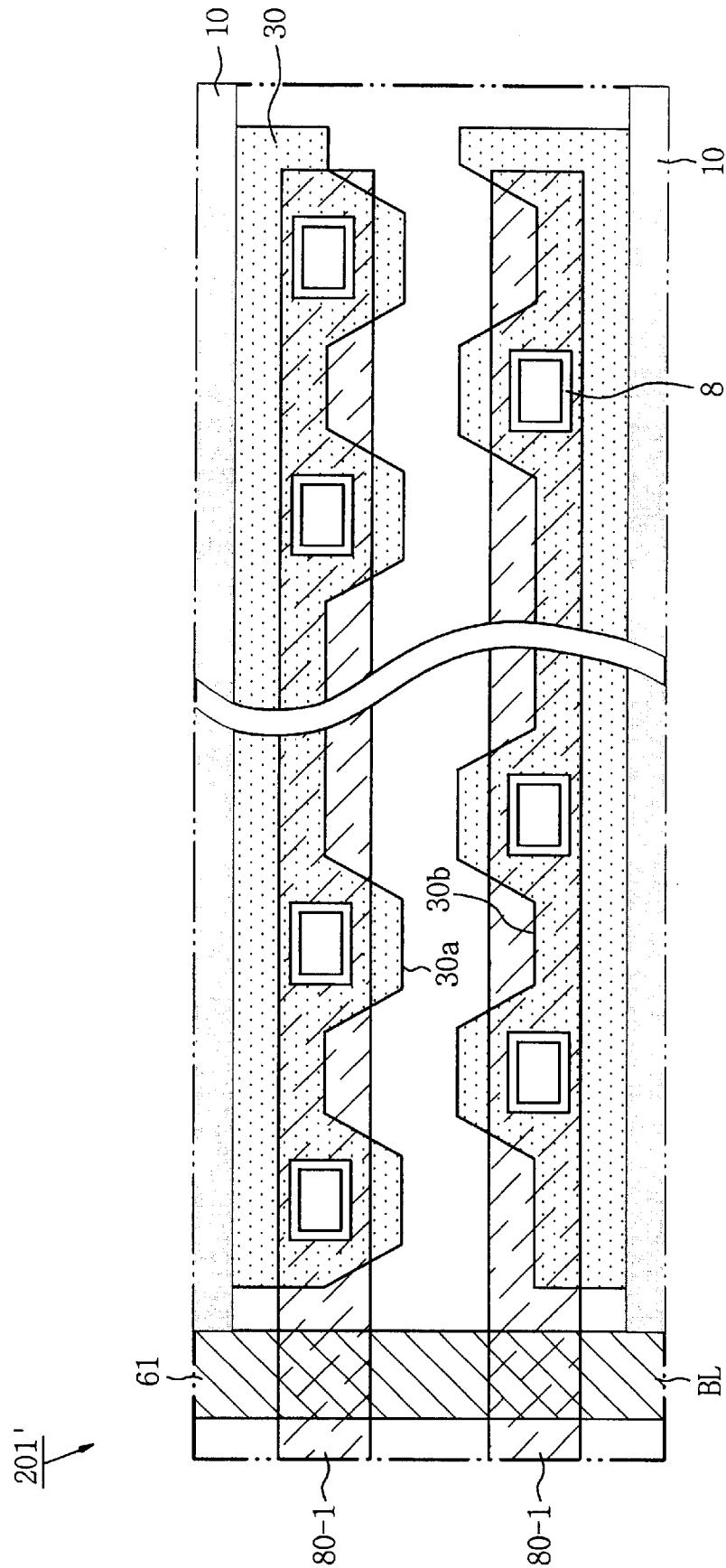
FIG. 6 is a top plan view illustrating a non-shared, active region of transistors in accordance with an embodiment of the present invention.

FIG. 4 is a plan view illustrating a partial layout structure of column pass transistors of a semiconductor memory device in accordance with a first embodiment of the present invention. As shown in FIG. 4, a part ABCD surrounded with a dash-dot broken line shows a part of the layout structure. FIG. 5 is a top plan view illustrating an arrangement of a single transistor 100-1-*a* in the layout structure of column pass transistors in accordance with the first embodiment of the present invention. FIG. 6 is a top plan view illustrating the layout structure of a non-shared active region of transistors in accordance with the first embodiment of the present invention.

In the column path layout structure of a semiconductor memory device of the present invention, first and second transistors [100-*i*-*a*] of the active regions 20 and 30 of the same conductivity type and arranged longitudinally are respectively connected with a plurality of memory cells (not shown in FIGS. 4 through 6). The transistors are further connected with the bit line pairs BL/BLB 61. The longitudinal transistor region is arranged approximately in perpendicular to the longitudinal direction (Y-axis) of the bit line pairs 61. In FIG. 4, all the bit line pairs respectively connected with the memory cells positioned at the upper part of the first and second transistors [100-*i*-*a*] are not shown to clearly illustrate the layout structure of the first and second transistors which are arranged in perpendicular to the bit line pairs 61. However, FIG. 5 illustrates the layout structure constructed with first and second transistors [100-*i*-*a*] connected in perpendicular to the bit line pairs.

The bit line pairs BLi/BLBi 61 are the first metal layer, and run in parallel with the Y-axis. Sources or drains 20 or 30 (one such source 20 being shown in FIG. 5) of the first and second transistors are arranged in perpendicular to the bit line pairs 61. The drains 30 out of the active regions of the first transistors for bit lines BLi (not shown) are connected with the bit lines pair 61, and the sources 20 are connected with the section data lines SDL_W 71. Also, the drains 30 of the first transistors for bit line bar BLBi (not shown in FIG. 5) are connected with the bit line bars BLBi, 61, and the sources 20 are connected with the section data line bars SDLB_W 71. Furthermore, the first and second transistors connected to the bit line pairs of the identical memory cells and one side of sources 20 of the first and second transistors connected to the bit line pairs of adjacent memory cells are made in a shared arrangement. This is indicated in FIG. 5 by a single, contiguous shaded region 20. The sources 20 are shared in their arrangement between neighboring memory cells to reduce the area occupied with transistors. The section data line pairs SDL_W/SDLB_W 71 (made of a first metal, e.g., aluminum (AL), identically with the bit line pairs 61) are positioned in parallel to the bit line pairs 61. In order to use the layout space efficiently, the section data line pairs 71 are connected with the sources 20 of the entire or partial groups of transistors. In other words, to make the ratio of section data line pairs to transistors 1:n (where n is a positive integer), the sources of some or all transistors are connected to one of the section data line pairs 71. As a result, there is a significant reduction in the layout space contrasted with the prior structure where the ratio between the section data lines and the number of transistors is 1:1. There will be described herein more embodiments of the layout structure in which the sources of the transistors are shared in arrangement with the section data line pairs 71.

FIGS. 5 and 6 illustrate the layout structures of the section data line pairs in accordance with the third and fourth embodiments of the present invention. Furthermore, drains 30 of the first and second transistors are respectively in contact with the first contact lines 80-1 of metal conductivity type layers, e.g. tungsten layers. First contacts 40-1 are formed where the first contact lines 80-1 cross one of the bit line pairs 61, so that the drains 30 are connected to the bit line pairs 61. The sources 20 of the first and second transistors are respectively in contact with the second contact lines 80-2 of the metal conductivity layers, e.g. tungsten layers. The second contacts 40-2 are formed where the second contact lines 80-2 cross one of the section line pairs 71 shown in FIG. 4, so that the sources 20 are connected to the section line pairs 71. It is preferable that the third contacts 8 are formed at the sources and drains of the first and second transistors and at the first and second contact lines 80-1, 80-2 to reduce loading or contact resistance. The sources 20 contact the section data line pairs 71 through the second contact lines 40-2. Also, the drains 30 contact the bit line pairs 61 through the first contact lines 40-1.

FIG. 5 shows the layout structure of a single column pass transistor [100-1-*a*] connected to the first bit line BLi arranged under the bit line pairs 61 connected to a plurality of memory cells. The bit lines BL1, the bit line bars BLBi to be connected to neighboring memory cells are arranged adjacently. For instance, in case of eight (8) memory cells, there is the same sequential arrangement of bit line pairs as in FIG. 5. In other words, the bit line pairs are arranged in parallel to the Y-axis, in a sequence of BL1, BLB1, BLB2, BL2, BL3, BLB3, ..., BL7, BLB7, BLB8, BL8. Section data line pairs 71, which are identical first metal lines neighboring the bit line BL8 extending in parallel to the bit lines. FIG. 5 illustrates the first transistor connected to the first bit line BL1. There are sources 20, gates 10 and drains 30 in the first transistor. Though not shown in FIG. 5, the gates 10 of the first transistor are connected with those of the second transistor to form gate electrodes. In drains 30, non-shared (i.e. not connected in common) active regions of the first transistor are connected to the first contact line 80-1, so as to contact the first bit lines BL1 through the first contact 40-1. In sources 20, shared active regions of the first transistor are connected to the second contact line 80-2, so as to contact the section data lines SDL_W through the second contact 40-2. A number of the third contacts 8 are formed between the sources 20 and the second contact lines 80-2 to reduce loading.

Similarly, a number of the third contacts 8 are formed between the drains 30 (not shown in FIG. 5 but shown in FIG. 6) and the first contact lines 80-1 to reduce loading. On the other hand, edges of the non-shared active region of the first transistors, drains 30, may be formed in a proper shape, for instance, in a serrated shape as shown to reduce the junction area of bit lines. As shown in FIG. 6, edges of the drains, non-shared active regions of the next neighboring transistors, where they are in contact together, are formed in the serrated shape to be in a toothed (separated) mesh. A number of the first contact lines 80-1 and the third contacts 8 are formed at the teeth of the serrated active regions. The layout structure thus constructed is advantageous in reducing capacitance and minimizing the required layout area.

Now, high integration of memory cells will be considered. Above all, it should be considered in what type of a layout structure is available for the first and second transistors in the size of the total memory cells that can reduce the layout area for the column path transistors. The first method is to make a multi-row layout structure of the first and second transistors arranged in perpendicular to the bit line pairs of a predetermined length within the size of memory cells. The second method is to make a matrix (multi-row and multi-column) layout structure of a predetermined number of the first and second transistors, arranged in perpendicular to the bit line pairs, of a predetermined length within the size of memory cells. (Refer to the layout structures shown in FIGS. 8 and 9.) For convenience, the first and second transistors, respectively related with bit lines BL and bit line bars BLB, can be arranged in the order of top/bottom or bottom/top.

On the other hand, a predetermined size of spaces are formed toward both columns of a predetermined number of or the total number of the memory cells for gate signals Yi in the layout structure of the first and second transistors. (Refer to the layout structure shown in FIGS. 8 and 9.)

Furthermore, the layout structure of the read path column pass transistors that have not been described in the first embodiment of the present invention can be arranged in the identical structure over or under the aforementioned layout structure of the write path column pass transistors. As shown in the prior art, the PMOD transistors for bit lines BL or bit line bars BLB may be also arranged in a layout structure in parallel to the bit line pairs.

The layout structure of the read or write path column pass transistors (NMOS and PMOS transistors) applied to the present invention can be arranged as follows in Table 1.

TABLE 1

|  | Case 1 | Case 2 | Case 3 | Case 4 |
|---|---|---|---|---|
| NMOS | Top, vertical layout | Bottom, vertical layout | Top, vertical layout | Bottom, vertical layout |
| PMOS | Bottom, vertical layout | Top, vertical layout | Bottom, horizontal layout | Top, horizontal layout |

In case, the write path NMOS transistors and the read path PMOS transistors are respectively arranged at the top and bottom in the layout structure of the column path transistors of the memory cell interface, so that all the NMOS and PMOS transistors are arranged in perpendicular to the bit line pairs. In case 2, the write path NMOS transistors and the read path PMOS transistors are respectively arranged at the bottom and top parts in the layout structure of the column path transistors of the memory cell interface, so that all the NMOS and PMOS transistors are arranged in perpendicular to the bit line pairs. In case 3, the write path NMOS transistors and the read path PMOS transistors are respectively arranged at the top and bottom parts in the layout structure of the column path transistors of the memory cell interface, so that the NMOS transistors are arranged in perpendicular to the bit line pairs, but the PMOS transistors are arranged in parallel to the bit line pairs. In case 4, the write path NMOS transistors and the read path PMOS transistors are respectively arranged at the bottom and top parts in the layout structure of the column path transistors of the memory cell interface, so that the NMOS transistors are arranged in perpendicular to the bit line pairs, but the PMOS transistors are arranged in parallel to the bit line pairs. As shown in the first embodiment of the present invention, the layout structure of the column pass transistors connected with memory cells is formed to accomplish the aforementioned objects of the present invention. Another embodiment of the present invention will be described with reference to FIGS. 8 and 9.

Figure 8:
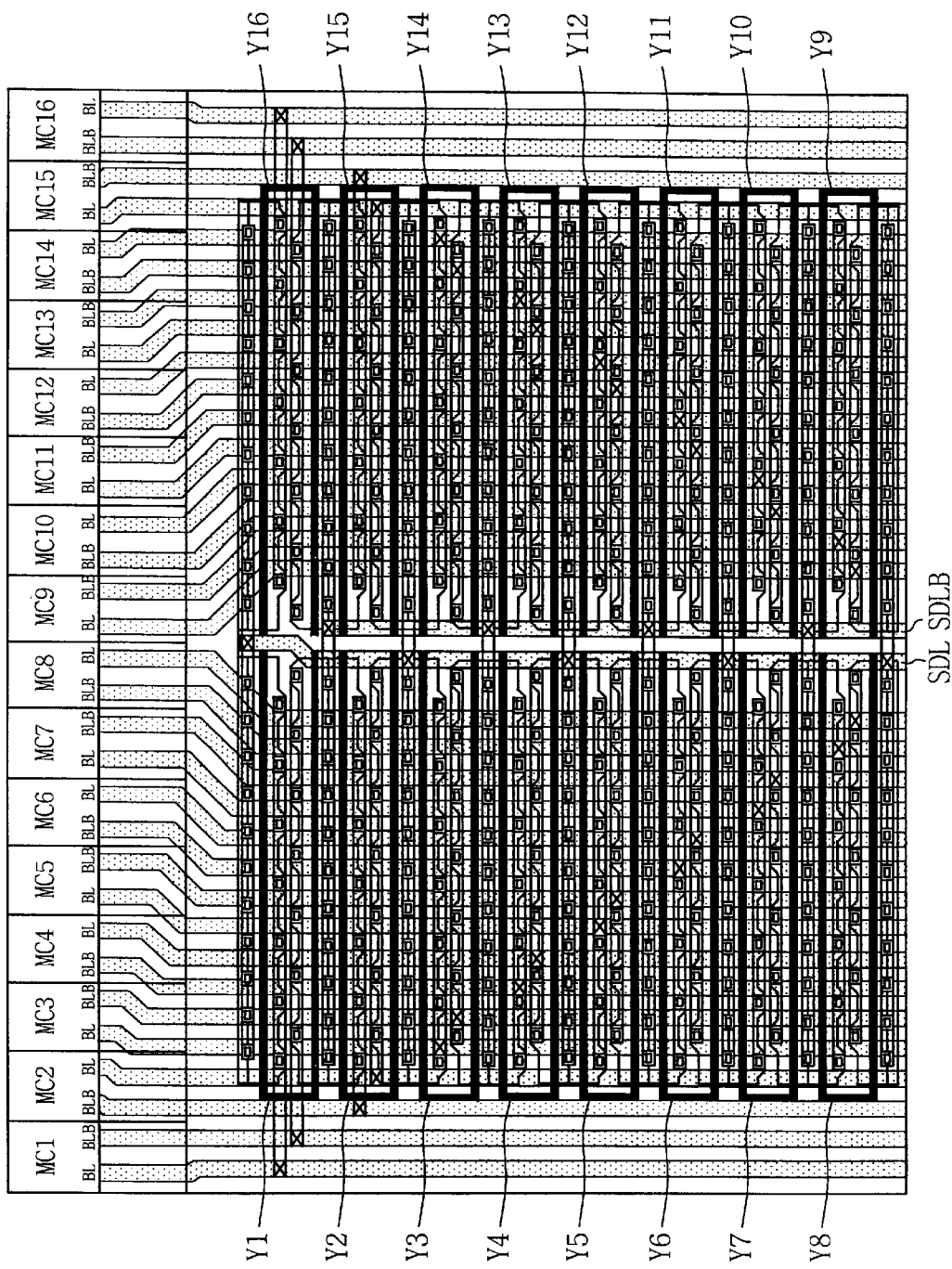
FIG. 8 is a top plan view illustrating the layout structure of column pass transistors applied to sixteen column memory cells of a semiconductor memory device in accordance with a second embodiment of the present invention.
Figure 9:
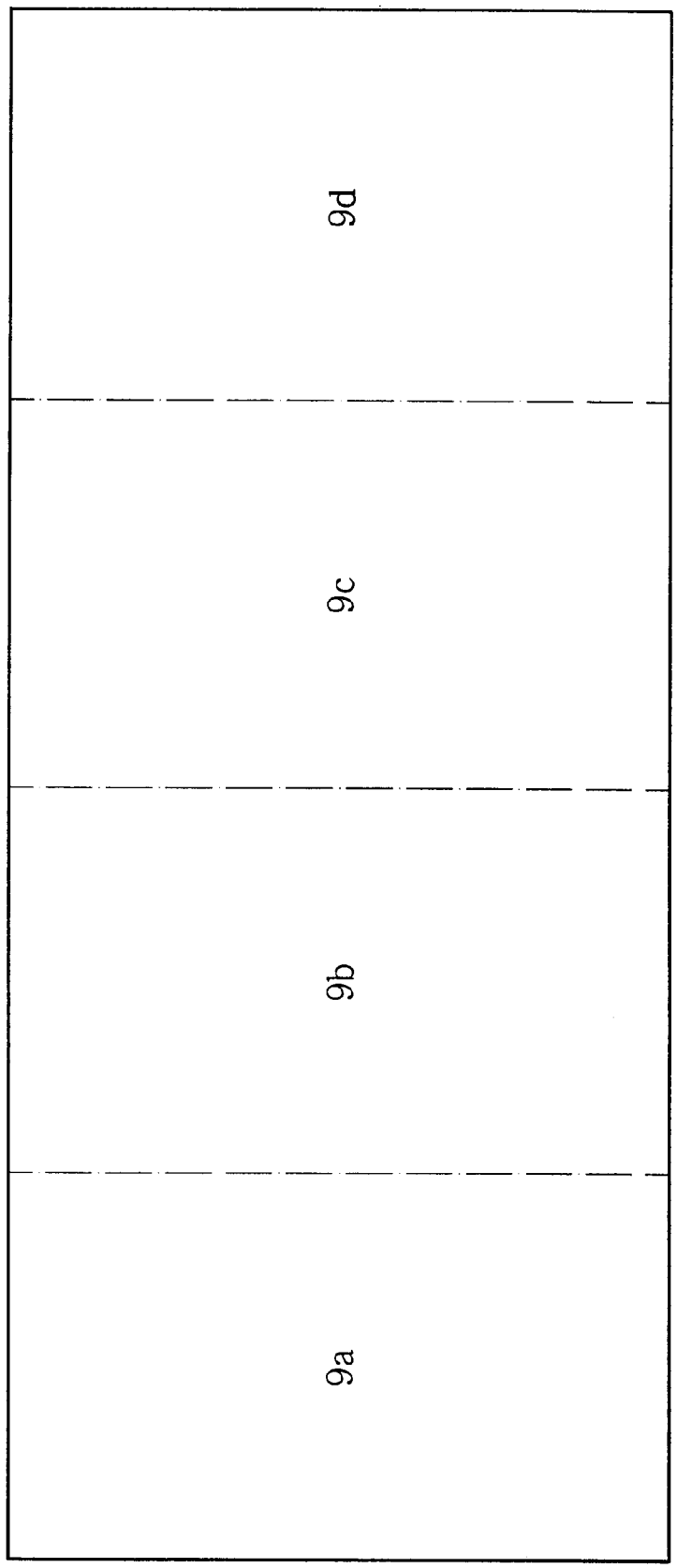
FIGS. 9a through 9d are plane views for illustrating a layout structure of column pass transistors applied to 32 column memory cells of a SRAM in accordance with a third embodiment of the present invention.
Figure 9A:
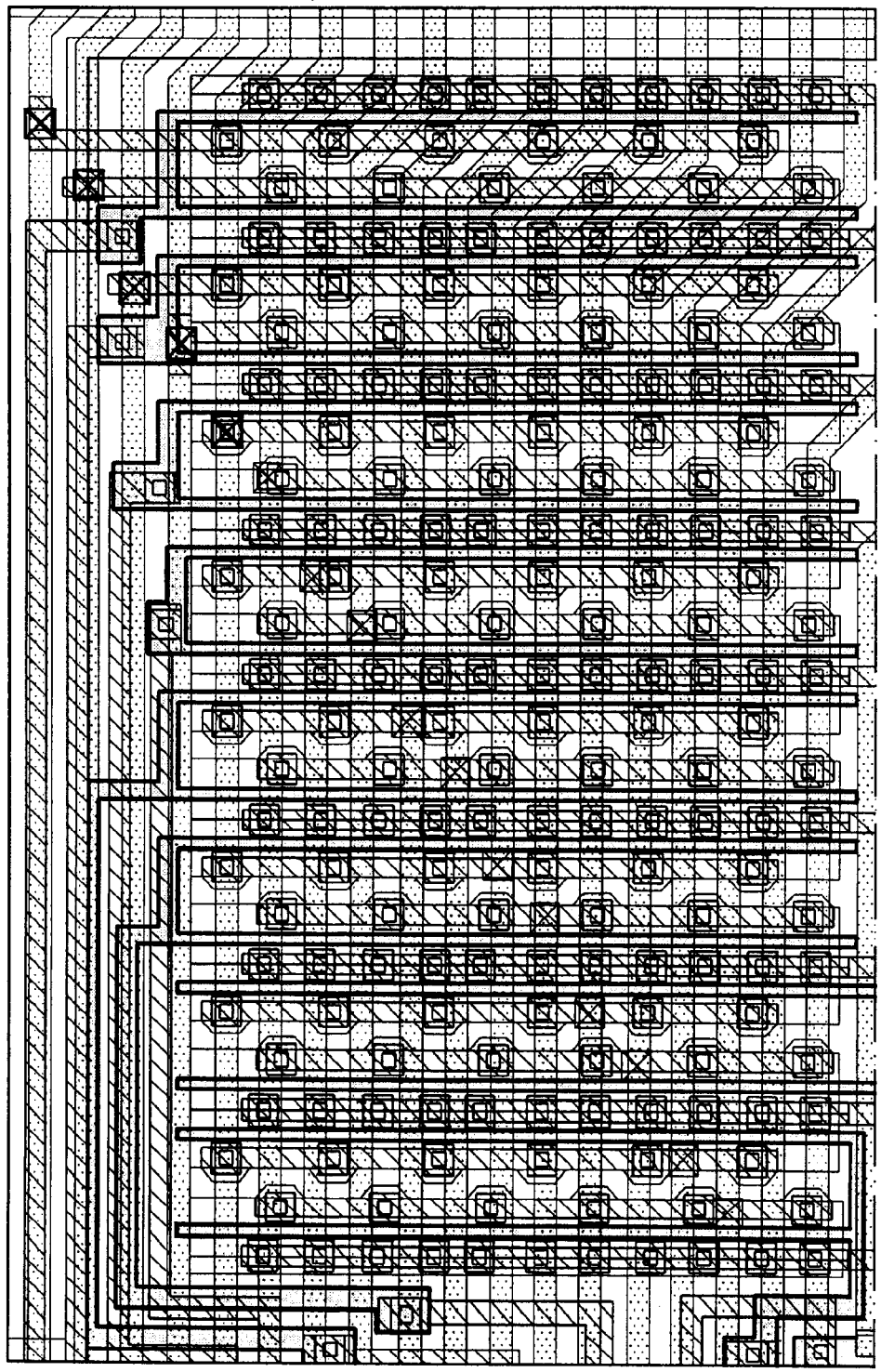
Figure 9B:
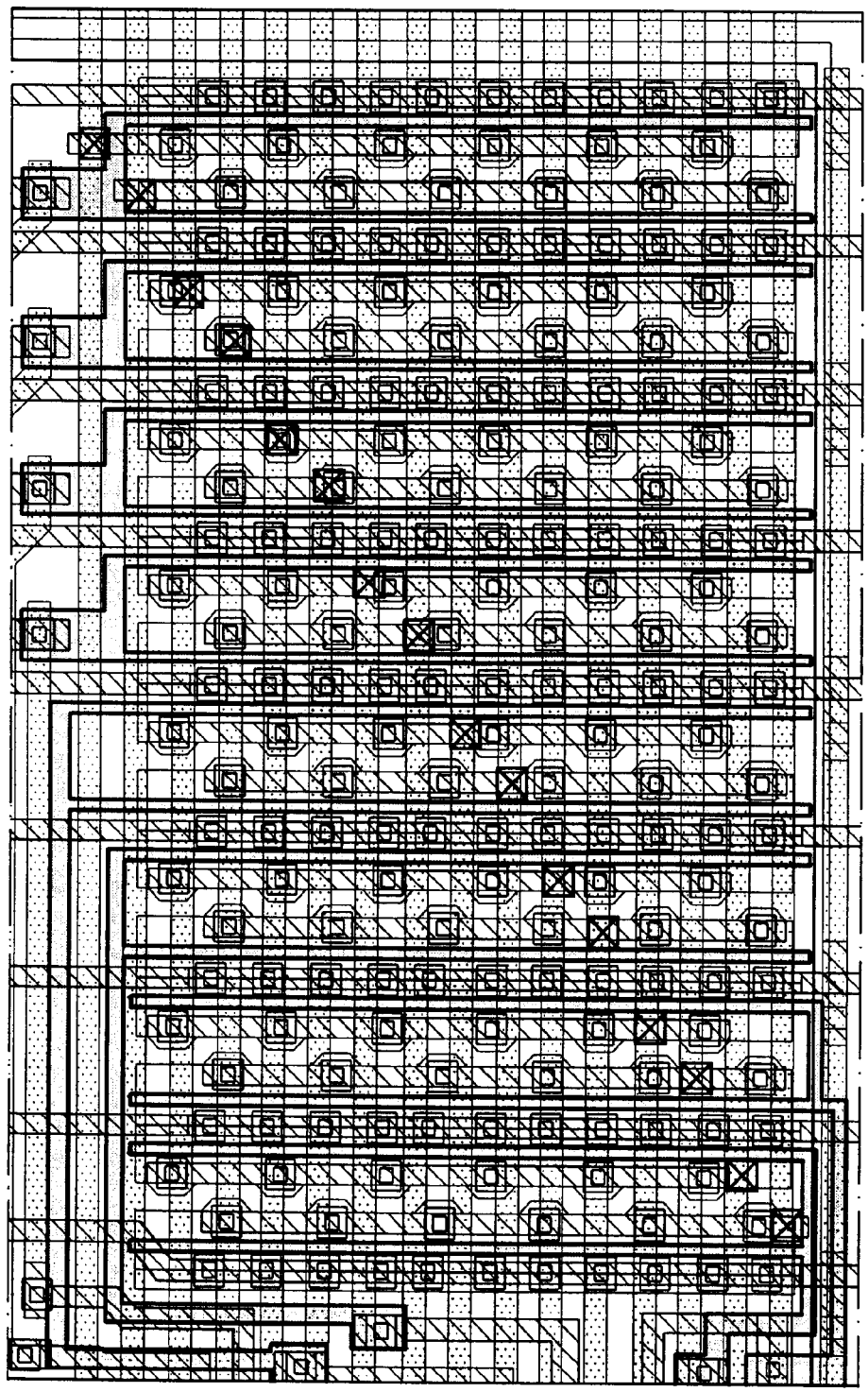
Figure 9C:
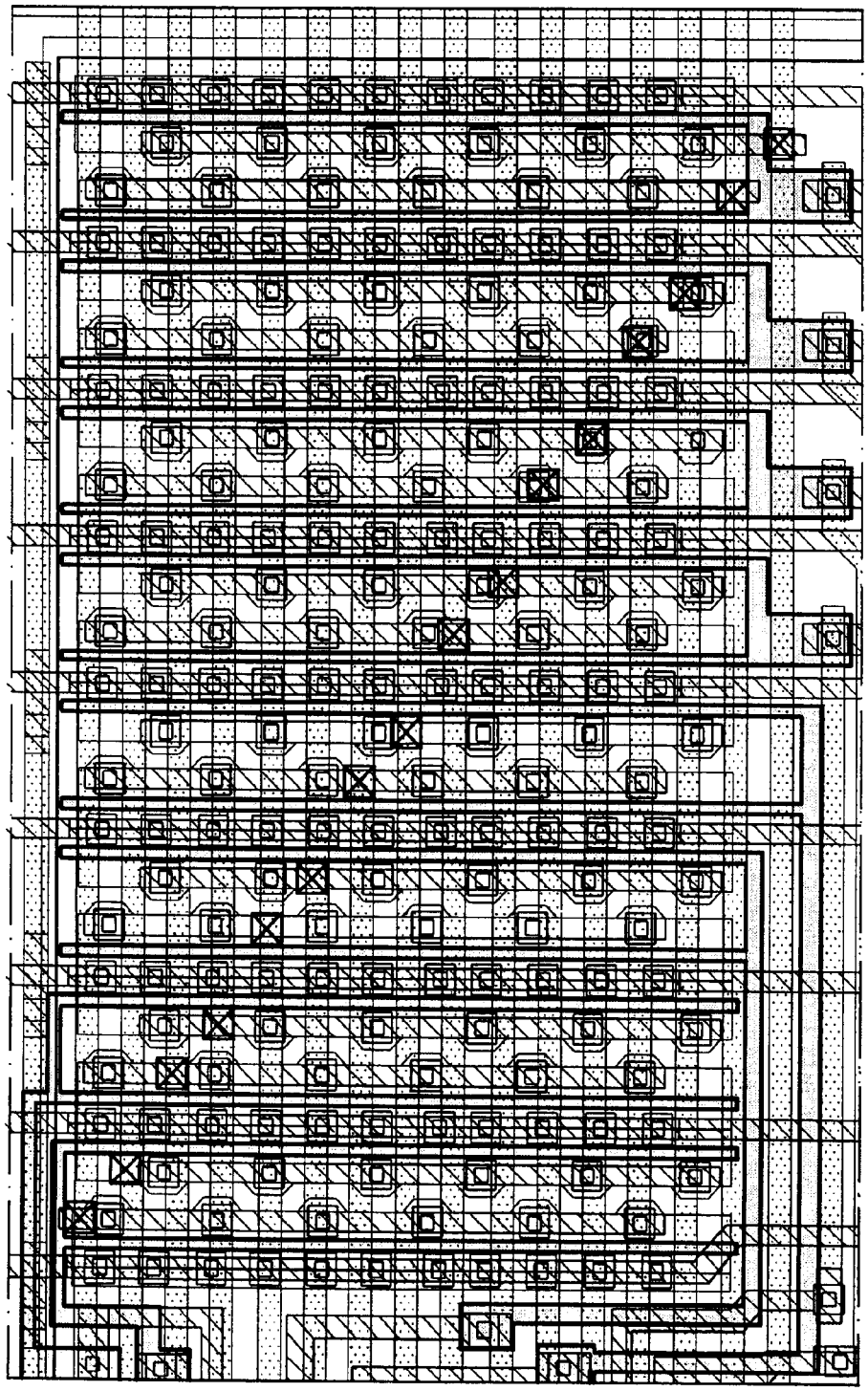
Figure 9D:
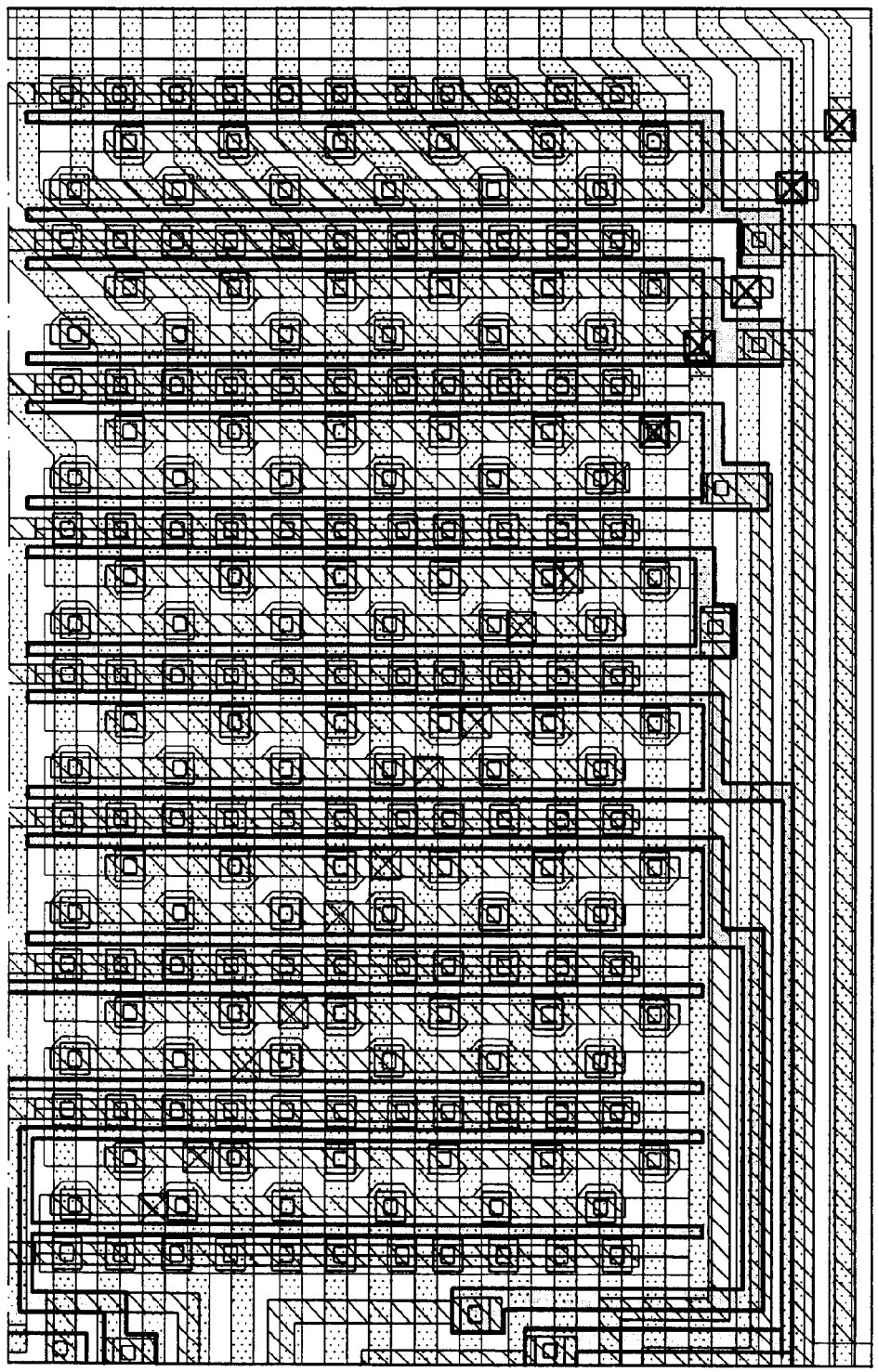

FIG. 8 is a top plan view illustrating the layout structure of column pass transistors applied to sixteen memory cells of a semiconductor memory device in accordance with the second embodiment of the present invention. FIG. 9 (specifically FIGS. 9a through 9d) is a top plan view illustrating the layout structure of column pass transistors applied to thirty-two memory cells of an SRAM in accordance with the third embodiment of the present invention. In the layout structure shown in FIGS. 8 and 9, only write path NMOS transistors connected with memory cells (as well as read path column pass transistors) are illustrated, but PMOS transistors can also be constructed in the same cases as shown in Table 1. FIG. 8 illustrates an embodiment of the layout structure of column pass transistors connected with sixteen column memory cells, wherein sixteen transistors for column memory cells are arranged in two columns with the bit line pairs connected with memory cells. Section data line pairs are arranged in parallel to the bit line pairs in the commonly arranged active regions of thirty-two transistors between the eighth and ninth memory cells MC8, MC9. All the transistors arranged in the same row are connected as one. Also, thirty-two non-shared active regions are respectively connected with bit lines BL or bit line bars BLB respectively belonging to their own areas. Spaces of a predetermined size are formed for gate signals Y1–Y16 of transistors at both sides of the total sixteen column memory cells. The layout structure shown in FIG. 8 is similarly formed to that of the first embodiment of the present invention described above, so that repeated descriptions will be omitted. It is preferable that the contact lines should be arranged to make a short contact between the active regions and bit lines or section data lines. On the other hand, dummy cell arrays are positioned between the layout space of transistors and memory cells.

FIG. 9 illustrates an embodiment of the layout structure of NMOS column pass transistors connected with thirty-two column memory cells. In FIG. 9, the section data line pairs are arranged in parallel to the bit lines in each space.

Having described specific preferred embodiments of the invention with reference to the accompanying drawings, it is to be understood that the invention is not limited to those precise embodiments, and that various changes and modifications may be effected therein by one skilled in the art without departing from the scope of spirit of the invention as defined in the appended claims.

As described above, the invention discloses a new layout structure and method for efficiently arranging column pass transistors within a space to be occupied with memory cells, the overall structure representing a far more efficient use of space than in the prior art.

Also, the layout structure of the present invention is advantageous in reducing its own area of column pass transistors.

In addition, there is an advantage in the present invention in that the section data lines commonly connecting bit lines and input/outputs may be made of the same material to reduce loading therein.

The invention makes an essential contribution to minimizing the size of a chip in a semiconductor memory device.

What is claimed is:

1. A column path layout structure of a semiconductor memory device, comprising:
   a plurality of memory cells;
   a pair of bit lines electrically connected to said plurality of memory cells, the pair of bit lines having a longitudinal direction; and
   first and second column path transistors having active regions,
   the active regions having a longitudinal direction perpendicular to the longitudinal direction of said pair of bit lines,
   wherein edges of the remaining non-shared active regions of the transistors are formed in a saw-like shape to be in mesh with directly adjacent non-shared active regions.

2. The structure, as defined in claim 1, wherein a layout structure of first and second transistors comprises:
   one of drains and sources being connected to one of the bit line pairs and the other drains and sources being connected to one of section data line pairs;
   some of the active regions of the first and second transistors being connected in common to bit line pairs of memory cells adjacent to the first and second transistors that are connected with bit line pairs of the identical memory cells, thereby providing shared action regions of the first and second transistors, others of the active regions of the first and second transistors not being connected in common; and
   the shared active regions of the first and second transistors being in contact with the section line pairs through a second contact line and remaining non-shared active regions of the first and second transistors being in contact with the bit line pairs through a first contact line.

3. The structure, as defined in claim 2, wherein the active regions of the first and second transistors respectively connected to the bit line pairs are respectively in contact with the first contact line and the first contacts are formed where the first contact line and the bit line pairs cross each other.

4. The structure, as defined in claim 2, wherein the active regions of the first and second transistors respectively connected with the section data line pairs are in contact with the second contact line and the second contacts are formed where the second contact line and the section data line pairs cross each other.

5. The structure, as defined in claim 1, wherein the first and second transistors are write path NMOS transistors and read path PMOS transistors, respectively.

6. The structure, as defined in claim 2, wherein the section data line pairs, which are made of a metal identical with the bit lines, are arranged in parallel to the bit line pairs.

7. The structure, as defined in claim 1, wherein the first and second transistors are arranged in a multi-row structure of predetermined length within an area occupied by a predetermined total number of memory cells.

8. The structure, as defined in claim 1, wherein the first and second transistors are arranged in a multi-column and multi-row matrix structure of a predetermined dimension with a predetermined number of transistors.

9. The structure, as defined in claim 8, wherein the first and second transistors are arranged in a predetermined top/bottom sequence with the first transistors for bit lines and the second transistors for bit line bars.

10. The structure, as defined in claim 7, wherein spaces of predetermined size are formed for gate signals at both sides of the predetermined number of memory cell columns within the area occupied by the total memory cells in the arrangement of the first and second transistors.

11. The structure, as defined in claim 6, wherein the first metal is aluminum.

12. The structure, as defined in claim 3, wherein the first contact line comprises tungsten.

13. The structure, as defined in claim 4, wherein the second contact line comprises tungsten.

14. A column path layout structure of a semiconductor memory device comprising:
   bit line pairs respectively connected to a plurality of memory cells at a predetermined gap between the memory cells in parallel to a Y-axis; and
   active regions of write path NMOS transistors and those of read path PMOS transistors longitudinally formed in perpendicular to the bit line pairs,
   wherein active regions of the write path NMOS transistors and those of read path PMOS transistors are longitudinally arranged in perpendicular to the bit line pairs, and wherein the write path NMOS transistors and the read path PMOS transistors are respectively arranged over and under the bit line pairs, and
   wherein the write and read column path layout structure further comprises:
      section data line pairs positioned in parallel to the bit line pairs;
      first contact lines of a metal conductivity layer are positioned under the bit line pairs to be in contact with the section data line pairs through the second contact;
      second contact lines of a metal conductivity layer are positioned under the bit line pairs to be in contact with the section data line pairs through the second contact; and
      transistors positioned under the contact lines, the transistors having gates and drain and source active regions, the active regions being arranged in perpendicular to the longitudinal direction of the bit line pairs, wherein first side regions of the drain/source active regions are in contact with the first contact lines that cross the bit line pairs to be connected in a saw-like shape mesh through the first contact at an edge, another side region of the drain/source active regions being shared with the transistors of adjacent memory cells and, being in contact with the second contact lines via the second contact, wherein the second contact lines and section data line pairs cross each other and are connected with the section data line pairs, and the transistors forming spaces of a predetermined size at both sides of the column path having a predetermined number of memory cells within the area of the predetermined number of total memory cells, the first transistors for bit lines and the second transistors for bit line bars being arranged in a top/bottom sequence and being connected with the bit line pair.

15. The structure, as defined in claim 14, wherein the active regions of the write path NMOS transistors and read path PMOS transistors are arranged in perpendicular to the longitudinal direction of the bit line pairs, and wherein the read path PMOS transistors are positioned over the bit line pairs and the write path NMOS transistors are positioned under the bit line pairs.

16. The structure, as defined in claim 14, wherein the active regions of the write path NMOS transistors, which are positioned over the bit line pairs, are arranged in perpendicular to the longitudinal direction of the bit line pairs, and wherein the active regions of the read column path PMOS transistors, which are positioned under the bit line pairs, are arranged in parallel to the longitudinal direction of the bit line pairs.

17. The structure, as defined in claim 15, wherein the write and read column path layout structure further comprises:

section data line pairs positioned in parallel to the bit line pairs;

first contact lines of a metal conductivity layer being positioned under of the bit line pairs to be in contact with the section data line pairs through the second contact;

second contact lines of a metal conductivity layer being positioned under the bit line pairs to be in contact with the section data line pairs through the second contact; and transistors positioned under the contact lines, the transistors having gates and drain and source active regions, the active regions being arranged in perpendicular to the longitudinal direction of the bit line pairs, wherein first side regions of the drain/source active regions are in contact with the first contact lines that cross the bit line pairs to be connected in a saw-like shape mesh through the first contact at an edge, another side region of the drain/source active regions being shared with the transistors of adjacent memory cells and being in contact with the second contact lines via the second contact, wherein the second contact lines and section data line pairs cross each other and are connected with the section data line pairs, and the transistors forming spaces of a predetermined size at both sides of the column path having a predetermined number of memory cells within the area of the predetermined number of total memory cells, the first transistors for bit lines and the second transistors for bit line bars being arranged in a top/bottom sequence and being connected with the bit line pairs.

18. The structure, as defined in claim 16, wherein the write column path layout structure comprises:

section data line pairs arranged in parallel to the bit line pairs;

the first contact lines of a metal conductivity layer being positioned under the bit line pairs to be in contact with the bit line pairs through the first contact; and the second contact lines of metal conductivity layer being positioned under the bit line pairs to be in contact with the section data line pairs through the second contact;

transistors being arranged under the contact lines, the transistors having gates, drain regions and source regions, the active regions being arranged in perpendicular to the longitudinal direction of the bit line pairs, the drain regions being respectively in contact with the first contact lines cross the bit line pairs through the first contacts to be in a saw-like shape at an edge, adjacent drain regions being in the form of a mesh, the source regions being shared with the transistors of adjacent memory cells and being in contact with the second contact lines via the second contact, wherein the second contact lines and the section data line pairs cross one another, the adjustment drain regions further being connected to the section data line pairs, and the transistors forming spaces of predetermined size at both sides of the column of a predetermined number of memory cells within the area of the predetermined total number of memory cells, the first transistors for bit lines and the second transistors for bit line bars being arranged in a top/bottom sequence and being connected with the bit line pairs.

* * * * *

UNITED STATES PATENT AND TRADEMARK OFFICE
CERTIFICATE OF CORRECTION

PATENT NO. : 6,700,168 B2
DATED : March 2, 2004
INVENTOR(S) : Yang

It is certified that error appears in the above-identified patent and that said Letters Patent is hereby corrected as shown below:

Column 3,
Line 31, "9d are plane views for illustrating" should read -- 9d are top plan views illustrating --.

Column 5,
Line 14, "as 'metal 100 line')" should read -- as 'metal $\Phi$ line') --.

Column 9,
Line 34, "active regions." should read -- active regions, and a contact is made with the first contact line at a protruding part of the saw-like shape active regions. --.

Signed and Sealed this

Sixth Day of July, 2004

JON W. DUDAS
*Acting Director of the United States Patent and Trademark Office*